(12) United States Patent  (10) Patent No.: US 6,509,546 B1
Egitto et al.  (45) Date of Patent: Jan. 21, 2003

(54) LASER EXCISION OF LAMINATE CHIP CARRIERS

(75) Inventors: Frank D. Egitto, Binghamton, NY (US); John S. Kresge, Binghamton, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/526,034

(22) Filed: Mar. 15, 2000

(51) Int. Cl.[7] ........................ B23K 26/18; B23K 26/00; H01L 25/00

(52) U.S. Cl. ............................ 219/121.68; 219/121.72; 219/121.75; 219/121.6; 219/121.67; 219/121.71; 219/14.69; 136/244

(58) Field of Search .................... 219/121.72, 121.61, 219/121.6, 121.67–121.69, 121.75, 121.71; 136/244

(56) References Cited

U.S. PATENT DOCUMENTS 3,410,979 A  11/1968 Larsson
3,626,141 A  * 12/1971 Daly .................... 219/121.68
4,054,479 A  10/1977 Peiffer (List continued on next page.)

Primary Examiner—Tom Dunn
Assistant Examiner—L. Edmondson
(74) Attorney, Agent, or Firm—Schmeiser, Olsen & Watts; Arthur J. Samodovitz

(57) ABSTRACT

A method and associated structure for excising laminate chip carriers from a panel that has a thickness less than about 100 mils. A laser beam is focused on a surface of the panel, and the panel is moved relative to the laser beam in a geometric pattern, such that cells of the panel (e.g., chip carriers) are excised from the panel. The laser parameters include a wavelength between about 500 nanometers and about 600 nanometers, a pulse width greater than about 100 nanoseconds and less than about 350 nanoseconds, an average power of at least about 1 watt, a pulse repetition rate between about 5,000 pulses/sec and about 20,000 pulses/sec, and a target diameter (D) between about 2 microns and about 30 microns. The kerf width between adjacent excised cells is between about 2 microns and about 75 microns. The width of an excised cell is at least 5 mm. A displacement between successive pulses of the laser beam is less than about 2D. The panel may comprise a layered structure that includes an organic layer and a metal layer. The laser includes, inter alia, a lasant of Nd:YAG, Nd:YLF, Nd:YAP, or Nd:YVO$_4$. The method of the present invention wastes less panel area by at least a factor of about 13 than does the mechanical excising techniques of the related art.

29 Claims, 5 Drawing Sheets

U.S. PATENT DOCUMENTS

| | | | |
|---|---|---|---|
| 4,092,515 A | | 5/1978 | Joslin et al. |
| 4,156,807 A | | 5/1979 | Howard et al. |
| 4,205,278 A | * | 5/1980 | George et al. .............. 359/343 |
| 4,820,897 A | * | 4/1989 | Lefevre ................ 219/121.61 |
| 4,853,758 A | * | 8/1989 | Fischer ....................... 257/529 |
| 4,915,981 A | | 4/1990 | Traskos et al. |
| 4,964,212 A | | 10/1990 | Deroux-Dauphin et al. |
| 5,034,591 A | * | 7/1991 | Fang ........................ 174/52.4 |
| 5,057,664 A | | 10/1991 | Johnson et al. |
| 5,059,256 A | | 10/1991 | Kanapenas et al. |
| 5,236,551 A | | 8/1993 | Pan |
| 5,260,963 A | | 11/1993 | Baird et al. |
| 5,323,414 A | | 6/1994 | Baird et al. |
| 5,453,134 A | * | 9/1995 | Arai et al. .................. 136/244 |
| 5,460,921 A | | 10/1995 | Cywar et al. |
| 5,473,624 A | | 12/1995 | Sun |
| 5,584,956 A | | 12/1996 | Lumpp et al. |
| 5,590,141 A | | 12/1996 | Baird et al. |
| 5,593,606 A | | 1/1997 | Owen et al. |
| 5,609,746 A | | 3/1997 | Farrar et al. |
| 5,614,114 A | | 3/1997 | Owen |
| 5,628,926 A | | 5/1997 | Belgacem et al. |
| 5,666,722 A | | 9/1997 | Tamm et al. |
| 5,702,565 A | * | 12/1997 | Wu et al. ..................... 117/44 |
| 5,703,631 A | | 12/1997 | Hayes et al. |
| 5,759,428 A | | 6/1998 | Balamane et al. |
| 5,808,272 A | | 9/1998 | Sun et al. |
| 5,841,099 A | | 11/1998 | Owen et al. |
| 5,843,363 A | | 12/1998 | Mitwalsky et al. |
| 5,870,289 A | | 2/1999 | Tokuda et al. |
| 5,887,520 A | | 3/1999 | Kinoshita |
| 6,060,683 A | * | 5/2000 | Estrada .................... 219/121.6 |
| 6,077,722 A | * | 6/2000 | Jansen et al. ............... 136/244 |
| 6,099,522 A | * | 8/2000 | Knopp et al. ................. 606/10 |
| 6,131,266 A | * | 10/2000 | Saunders .............. 219/121.71 |
| 6,168,744 B1 | * | 1/2001 | Malshe et al. ............. 264/400 |
| 6,343,369 B1 | * | 1/2002 | Saunders et al. .............. 716/4 |

* cited by examiner

LASER EXCISION OF LAMINATE CHIP CARRIERS

BACKGROUND OF THE INVENTION

1. Technical Field

The present invention relates to a method and associated structure for excising laminate chip carriers from a panel.

2. Related Art

Conventional methods of excising laminate chip carriers from a production panel, such as methods using mechanical routing and diamond saws, require a "kerf" or finite separation between excised chip carriers, which limits the number of chip carriers that can be formed from a given panel. The practical kerf width is typically at least about 1.5 mm inasmuch as the fabrication cost becomes prohibitively too expensive if the kerf width is below about 1.5 mm. This minimum kerf width of 1.5 mm is about 30% of the width of the 5 mm chip carriers in current use. In addition, chip carriers that include advanced materials (e.g., a copper-Invar-copper sandwich) are difficult to machine with mechanical methods.

A method is needed for excising chip carriers from a panel, wherein the method is suitable for advanced materials (e.g., a copper-Invar-copper sandwich) currently used in multilayered structures, and wherein the kerf width is negligibly small.

SUMMARY OF THE INVENTION

The present invention provides a method for excising cells of a panel, comprising the steps of:

focusing a laser beam on a surface of a panel, wherein the laser beam has a wavelength between about 500 nanometers and about 600 nanometers; and moving the panel relative to the laser beam in a geometric pattern, such that at least one cell of the panel is excised.

The present invention provides a laser structure, comprising:

- a panel having an organized configuration of at least two adjacent cells, wherein a kerf between said adjacent cells has a width between about 2 microns and about 75 microns; and
- a laser beam focused within the kerf, wherein the laser beam has a wavelength between about 500 nanometers and about 600 nanometers.

The present invention has the advantage of providing a method for forming chip carriers from a panel, such that the kerf width is negligibly small.

The present invention has the advantage of being suitable for advanced materials (e.g., , a copper-Invar-copper sandwich), currently used in multilayered structures.

The present invention has the advantage of being relatively inexpensive; i.e.; the present invention has little or no consumables, while the routers bits and diamond saws of conventional methods must be replaced periodically.

DETAILED DESCRIPTION OF THE INVENTION

Figure 1:
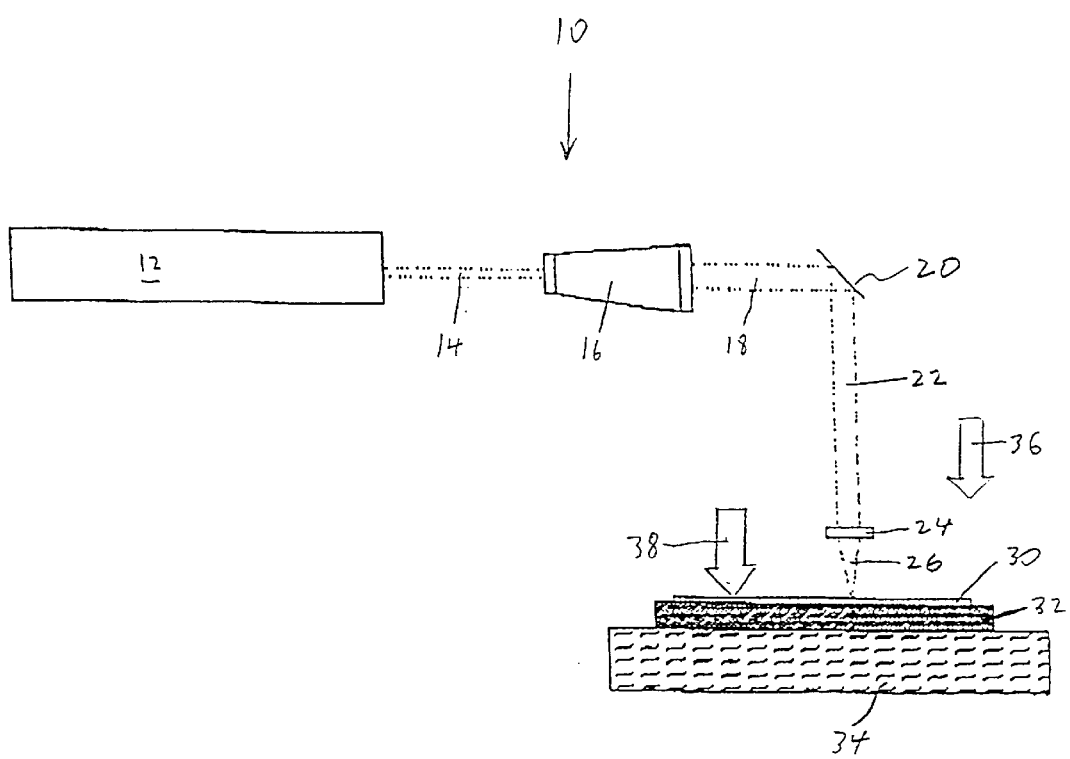
FIG. 1 depicts a front cross-sectional view of a laser system for excising cells from a panel, in accordance with preferred embodiments of the present invention.
Figure 2:
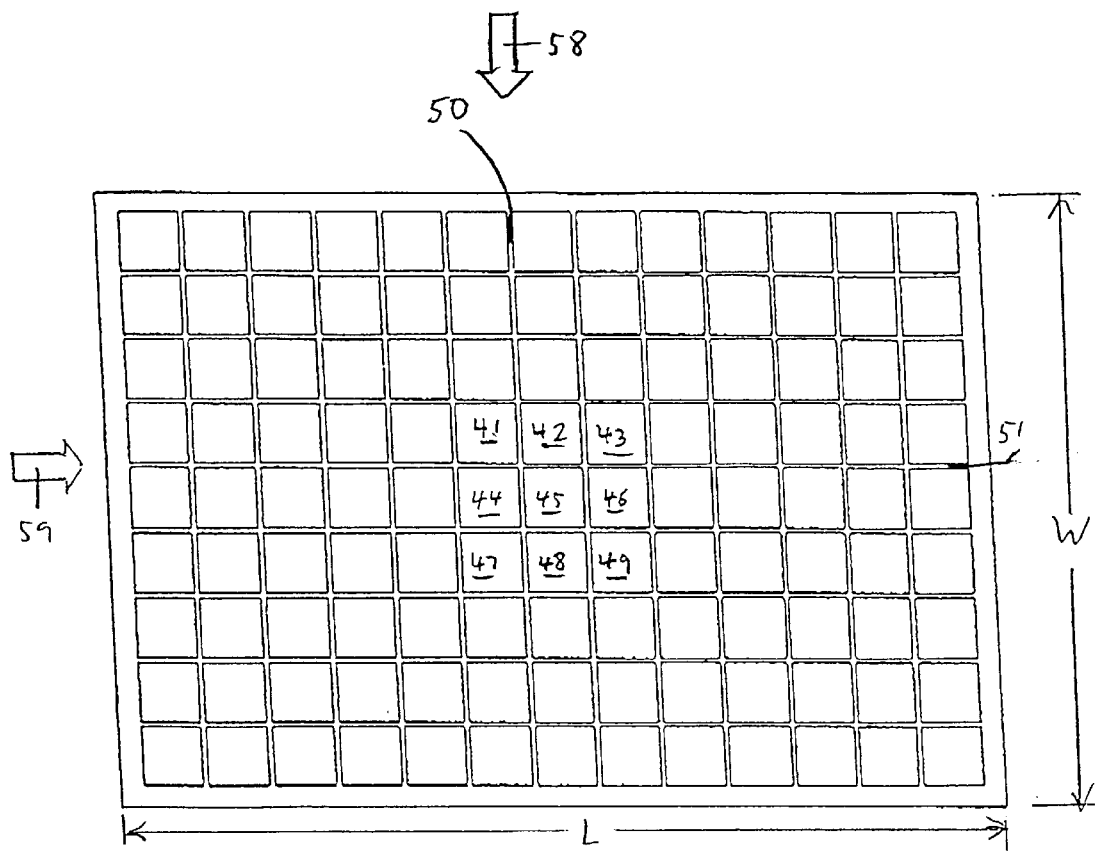
FIG. 2 depicts a top view of the panel of FIG. 1, showing cells and kerfs.

FIG. 1 illustrates a front cross-sectional view of a laser system 10 for excising cells from a panel 30, in accordance with preferred embodiments of the present invention. The panel 30 includes an organized configuration of cells as illustrated in FIG. 2. The panel 30 may comprise, inter alia, a layered structure that includes a dielectric layer (e.g., polyimide, epoxy, polytetrafluoroethylene) and a metal layer ( e.g., copper, aluminum stainless steel, molybdenum, Invar). The panel 30 has a thickness less than about 100 mils. Each cell may include, inter alia, a chip carrier. In FIG. 1, the laser system 10 includes a laser source 12 which emits a laser beam 14. The laser beam 14 travels through a beam expander 16 which transforms the laser beam 14 into the expanded laser beam 18. The expanded laser beam 18 strikes a turning mirror 20 which turns the expanded laser beam 18 as shown. The resulting turned laser beam 22 is focused by an objective lens 24, and the resulting focused laser beam 26 strikes the panel 30. The panel 30 rests on a vacuum chuck 32. There are a large number of depressurized holes in the vacuum chuck 32 which provide a vacuum that causes the panel to be held in place on the vacuum chuck 32. The vacuum chuck 32 is coupled to a stage 34. The stage 34 can be moved under manual control or program control, in a plane that is preferably about normal to the direction 36 of the focused laser beam 26. The direction 36 of the focused laser beam 26 may differ by no more than about 10 degrees from the direction 38 that is normal to the panel 30. Since the panel 30 is held in place by the vacuum chuck 32, the panel 30 moves with the stage 34. Generally, the panel 30 can be moved relative to the focused laser beam 26 by: holding the focused laser beam 26 in place while moving the panel 30 in a geometric pattern, by holding the panel 30 in place while moving the focused laser beam 26 in the geometric pattern, or by moving the panel 30 and the focused laser beam 26 simultaneously such as by using a compound beam positioner. The motion of the panel 30 relative to the focused laser beam 26 excises at least one cell of the panel 30.

The focused laser beam 26 has a wavelength between about 500 nanometers and about 600 nanometers, a pulse width greater than about 100 nanoseconds and less than about 350 nanoseconds, an average power of at least about 1 watt, and a pulse repetition rate between about 5,000 pulses/sec and about 20,000 pulses/sec.

The laser system 10 of FIG. 1 is merely illustrative of the numerous types of laser system configurations that may be used for excising cells from the panel 30. The laser of the present invention may be any of the laser types enumerated in col. 3, lines 31–34 of the U.S. Pat. No. 5,593,606 (Owen et al., 1997, hereby incorporated by reference). In particular, the laser (i.e., the laser source 12 in FIG. 1) preferably includes a sold-state lasant such as Nd:YAG, Nd:YLF, Nd:YAP, or Nd:YVO$_4$, but may alternatively include a YAG crystal that is doped with holmium or erbium.

FIG. 2 illustrates a top view of the panel 30 of FIG. 1. The panel 30 comprises cells, such as cells 41–49. The panel 30 has overall dimensions, as designated by a length L and a width W, large enough to accommodate at least one cell. Commonly used dimensions represented by L×W include 13 inches ×18 inches, 19.5×24 inches, and 24 inches×28 inches.

Each cell is excised from the panel 30 by moving the panel 30 relative to the focused laser beam 26 in a geometric pattern. The motion of the panel 30 relative to the focused laser beam 26 is either in a direction 58 or in a direction 59. The motion in the direction 58 generates a kerf oriented in the direction 58, such as the kerf 50. The motion in the direction 59 generates a kerf oriented in the direction 59, such as the kerf 51. The kerfs (e.g., the kerfs 50 an 51) constitute paths of wasted panel material that is ablated by the focused laser beam 26. The directions 58 and 59 are about perpendicular to each other in FIG. 2, which reflects the fact that the cells in FIG. 2 are organized as a rectangular array. In general, the cells of the panel 30 may be in an organized configuration in which each cell may have any geometrical shape and size. The geometric pattern of the motion of the panel 30 relative to the focused laser beam 26 generally reflects geometrical characteristics of the configuration of the cells.

Figure 3:
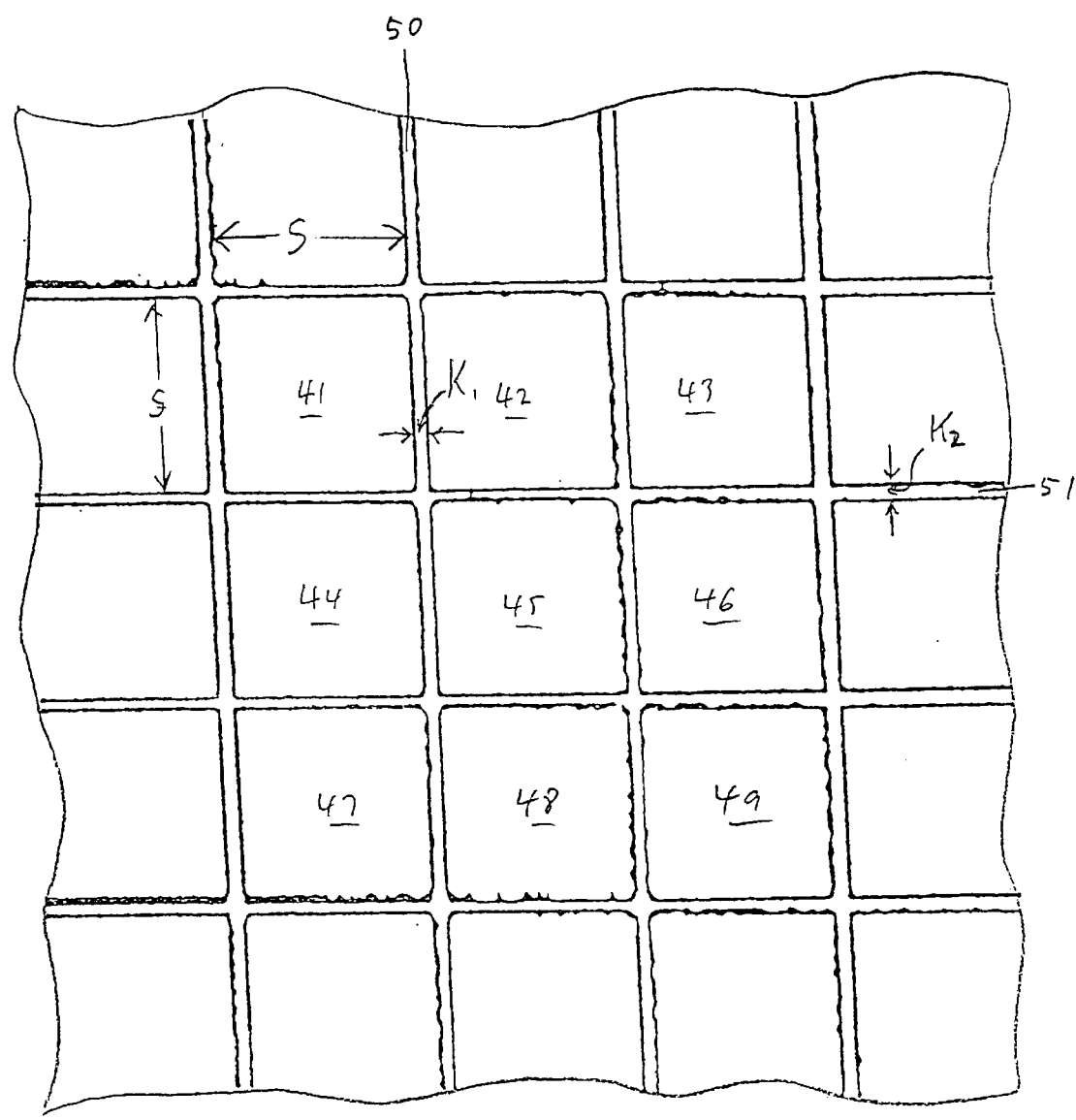
FIG. 3 depicts a magnified view of part of the panel in FIG. 2, showing 9 cells and associated kerfs.

FIG. 3 illustrates a magnified view of a part of the panel in FIG. 2 that includes the cells 41–49, as well as the kerfs 50 and 51 having kerf widths $K_1$, and $K_2$, respectively. Each cell in FIG. 3 has a square shape of length S on each side. S is at least about 5 mm. Commonly used values of S include 5 mm, 10 mm, 27 mm, 35 mm, 42.5 mm, 52 mm, and 55 mm. The kerfs (e.g., the kerfs 50 an 51) constitute paths of wasted panel material that is ablated by the focused laser beam 26. The kerfs are a consequence of several factors, including a first factor and a second factor. The first factor is that the focused laser beam 26 interacts with the material of the panel 30 ("target material") at small circular sites within the panel 30 ("target circles"). The target circles have a diameter, called a "target diameter," of magnitude D which is between about 2microns and about 30 microns (see infra FIG. 4 for an illustration of target circles). Defining a "target radius" R as D/2 and noting the energy of the focused laser beam 26 within a target circle decreases with radial distance from the center of the target circle in accordance with a guassian distribution, the target radius R is numerically determined as the radial distance from the center of the target circle at which the energy is $E_0/e^2$, wherein $E_0$ is the focused laser beam 26 energy at the center of the target circle, and wherein e=2.718. The second factor is that the laser ablation generates an extremely high local temperature (e.g., as high as about 30,000° K) which melts or vaporizes additional target material and effectively widens the kerf relative to the target diameter. Thus a kerf width K generally exceeds D and is between about 2 microns and about 75 microns. For a square cell, the fraction of panel 30 area that is wasted ("wastage") is given by the following equation:

$$\text{wastage} = [(S+K)^2 - S^2]/(S+K)^2 \quad (1)$$

Since K<<S the wastage of Equation (1) is approximately 2K/S to first order in K/S. Thus with S equal to 5 mm, and using a maximum K of 75 microns, the wastage with the present invention is no greater than about 0.03. Generally, the wastage with the present invention is no greater than about 0.1 5/S wherein S is expressed in millimeters. In contrast, a minimum practical kerf width is about 1.5 mm with the mechanical excising techniques of the related art. Accordingly, with S equal to 5 mm (corresponding to very thin cells) and using a minimum K of 1.5 mm, the wastage based on Equation (1), with the mechanical excising techniques of the related art, is 0.41. Thus with S=5 mm, the wastage with the present invention is at least a factor of about 13 less than is the wastage with the mechanical excising techniques of the related art. If the preceding calculations are repeated for S=55 mm (corresponding to much thicker cells), then the wastage is about 0.0027 with the present invention, and about 0.052 with the mechanical excising techniques of the related art. Thus with S=55 mm, the wastage with the present invention is at least a factor of about 19 less than is the wastage with the mechanical excising techniques of the related art.

As stated supra, the kerf width $K_1$ is between about 2 microns and about 75 microns. Similarly, the kerf width $K_2$ is between about 2 microns and about 75 microns. Although the kerf widths $K_1$ and $K_2$ are preferably about equal, $K_1$ and $K_2$ may differ.

Figure 4:
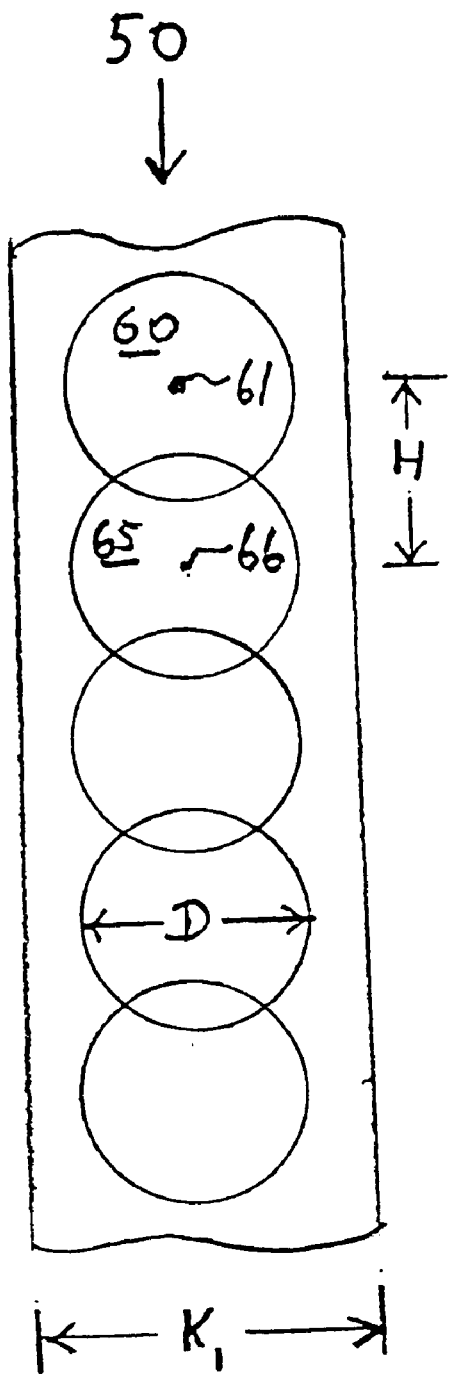
FIG. 4 depicts a magnified view of a kerf of FIG. 3.
Figure 5:
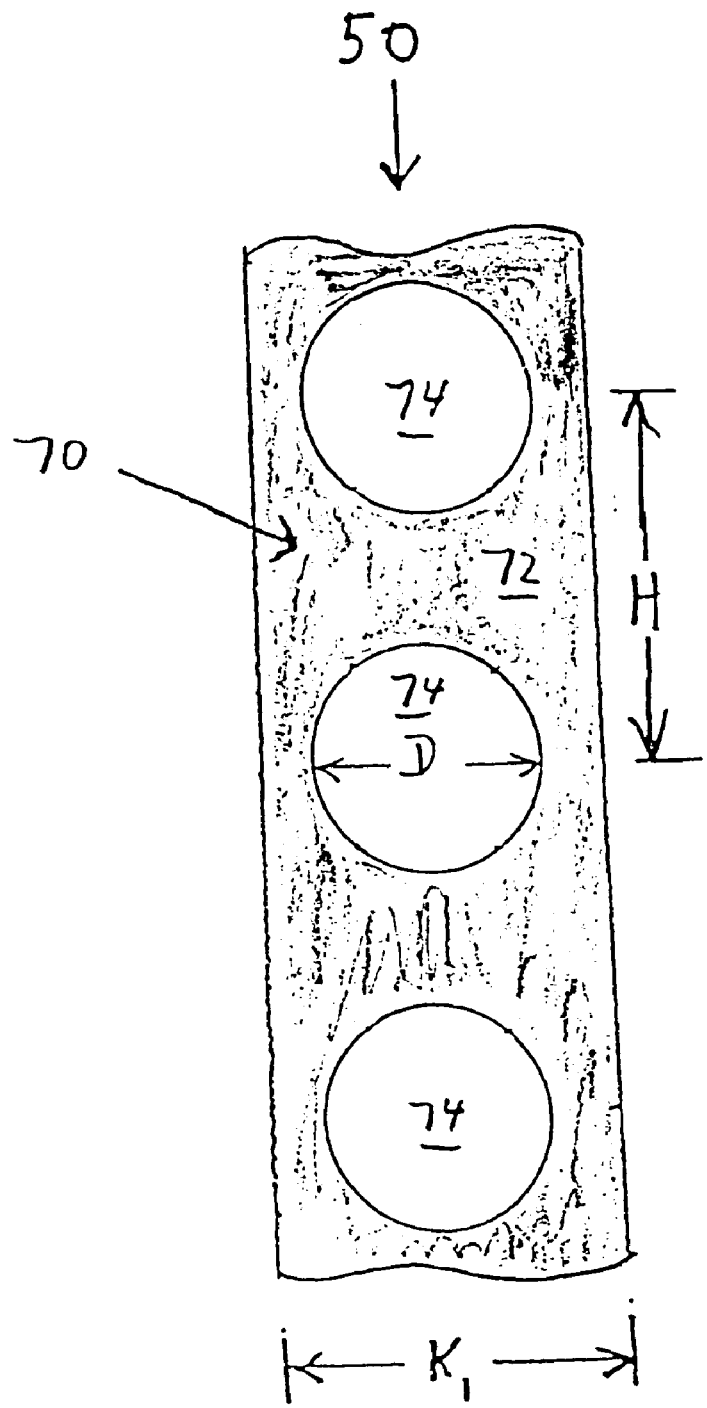
FIG. 5 depicts a postage stamp configuration within the kerf of FIG. 4.

FIG. 4 shows a magnified view of the kerf 50 of FIG. 3 and illustrates an embodiment of the present invention in which removal of the target material within the kerf 50 is accomplished by laser cutting. Laser cutting may include sequentially positioning the target circles of focused laser beam 26 on overlapping portions of the target material, such that a displacement H ("target displacement") between centers of target circles of successive pulses is less than the target diameter D. For example a target circle 60 (with radial center 61) overlaps a target circle 65 (with radial center 66), such that the target displacement H between the radial centers 61 and 66 is less than D. Alternatively, the target displacement H may exceed the target diameter D. Generally, H is any finite value that is less than about 2D. Since H depends on the smallest achievable relative velocity between the panel 30 and the focused laser beam 26 (which can be small compared with the target diameter D), and the highest achievable pulse repetition rate (i.e,. 20,000 pulses/sec), there is no practical limit lower limit to the value of H/D. Note that if H >D, then multiple passes of the focused laser beam 26 over the same kerf may be required if a single pass of the focused laser beam 26 leaves a "postage stamp" configuration due to an inability to cut away all of the material located within the kerf in the single pass. FIG. 5 illustrates a postage stamp configuration 70 within the kerf 50 of FIG. 4. The postage stamp configuration 70 comprises a material portion 72 that includes the target material, and a void portion 74. A first pass of the panel 30 relative to the focused laser beam 26 generates the postage stamp configuration 70. The postage stamp configuration 70 may be removed by at least one additional pass of the panel 30 relative to the focused laser beam 26, resulting in the cells 41, 44, and 47 being separated from the adjacent cell 42, 45, and 48 (see FIG. 3), respectively. Alternatively, the postage stamp configuration 70 may be subsequently removed mechanically such as by tearing the panel 30 along a path within the kerf 50, resulting in the cells 41, 44, and 47 being separated from the adjacent cell 42, 45, and 48, respectively. For a given H/D such that H/D >1, whether a first pass of the focused laser beam 26 leaves a postage stamp configuration 70 depends on the material being ablated in relation to the wavelength and energy of the focused laser beam 26.

It should be noted that the laser method of the present invention is suitable for advanced materials (e.g., a copper-Invar-copper sandwich), currently used in multilayered structures. It should be further noted that the laser method of the present invention is faster and produces a cleaner cut of the panel 30 than does the mechanical excising techniques of the related art.

While preferred and particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

We claim:

1. A method for excising cells of a panel, comprising the steps of:
   focusing a laser beam on a surface of a panel, wherein the laser beam has a wavelength between about 500 nanometers and about 600 nanometers, and wherein the panel comprises a layered structure that includes a dielectric layer and a metal layer; and
   moving the panel relative to the laser beam in a geometric pattern, such that at least one cell of the panel is excised, wherein said moving comprises:
      moving the panel relative to the laser beam in a first direction along a first kerf having a first width between a first pair of adjacent cells of the panel; and
      moving the panel relative to the laser beam in a second direction along a second kerf having a second width between a second pair of adjacent cells of the panel, and wherein the first and second directions are about perpendicular to each other.

2. The method of claim 1, wherein the laser beam has a pulse width greater than about 100 nanoseconds and less than about 350 nanoseconds.

3. The method of claim 1, wherein the laser beam has a target diameter (D) between about 2 microns and about 30 microns.

4. The method of claim 1, wherein the panel has a thickness less than about 100 mils.

5. The method of claim 1, wherein the first width and the second width are each between about 2 microns and about 75 microns.

6. The method of claim 1, wherein each cell of the panel has a width of at least 5 millimeters.

7. The method of claim 1, wherein a displacement between successive pulses of the laser beam is less than about 2D, wherein D is a target diameter of the laser beam.

8. The method of claim 1, wherein a displacement between successive pulses of the laser beam is greater than D and less than about 2D, wherein D is a target diameter of the laser beam, and wherein moving the panel relative to the laser beam in the first direction generates a postage stamp configuration within the first kerf.

9. The method of claim 8, wherein the moving step further comprises moving the panel relative to the laser beam such that the postage stamp configuration is removed.

10. The method of claim 8, further comprising mechanically removing the postage stamp configuration.

11. The method of claim 1, wherein the first width is about equal to the second width.

12. The method of claim 1, wherein the first width is unequal to the second width.

13. The method of claim 1, wherein a laser source of the laser beam includes a solid-state lasant selected from the group consisting of Nd:YAG, Nd:YLF, Nd:YAP, and Nd:YVO$_4$.

14. The method of claim 1, wherein the at least one cell is a chip carrier.

15. The method of claim 1, wherein the moving step includes holding the laser beam in a fixed position while moving the panel in accordance with the geometric pattern.

16. The method of claim 1, wherein the moving step includes holding the panel in a fixed position while moving the laser beam in accordance with the geometric pattern.

17. The method of claim 1, wherein the moving step includes moving the panel and the laser beam simultaneously in accordance with the geometric pattern.

18. A laser structure, comprising:
   a panel having a two dimensional array of cells, wherein a first kerf between a first pair of adjacent cells has a first width between about 2 microns and about 75 microns, wherein a second kerf between a second pair of adjacent cells has a second width between about 2 microns and about 75 microns, wherein the first and second kerfs have directional orientations that are about perpendicular to each other, and wherein the panel comprises a layered structure that includes a dielectric layer and a metal layer; and
   a laser beam focused within the first kerf, wherein the laser beam has a wavelength between about 500 nanometers and about 600 nanometers.

19. The laser structure of claim 18, wherein the laser beam has a pulse width greater than about 100 nanoseconds and less than about 350 nanoseconds.

20. The laser structure of claim 18, wherein the laser beam has a target diameter (D) between about 2 microns and about 30 microns.

21. The laser structure of claim 18, wherein the panel has a thickness less than about 100 mils.

22. The laser structure of claim 18, wherein each of the cells has a width of at least 5 millimeters.

23. The laser structure of claim 18, wherein each of the cells is a chip carrier.

24. The laser structure of claim 18, wherein the first width is about equal to the second width.

25. The laser structure of claim 18, wherein the first width is unequal to the second width.

26. A method for excising cells of a panel, comprising the steps of:
   focusing a laser beam on a surface of a panel, wherein the laser beam has a wavelength between about 500 nanometers and about 600 nanometers, and wherein the panel comprises a layered structure that includes a dielectric layer and a metal layer; and
   moving the panel relative to the laser beam in a geometric pattern, such that at least one cell of the panel is excised, and wherein the at least one cell is a chip carrier.

27. The method of claim 26, wherein the at least one cell has a width of at least 5 millimeters.

28. A laser structure, comprising:
   a panel having an organized configuration of at least two adjacent cells, and wherein the panel comprises a layered structure that includes a dielectric layer and a metal layer, and wherein each of the at least two adjacent cells is a chip carrier; and
   a laser beam focused within a kerf between said adjacent cells, wherein the laser beam has a wavelength between about 500 nanometers and about 600 nanometers.

29. The laser structure of claim 28, wherein said adjacent cells each have a width of at least 5 millimeters.

* * * * *